(12) United States Patent
Markert et al.

(10) Patent No.: US 6,225,377 B1
(45) Date of Patent: *May 1, 2001

(54) BLENDING EPOXY RESIN-POLYISOCYANATE-FILLER MIXTURE AND PHENOLIC RESIN-FILLER MIXTURE FOR MOLDING

(75) Inventors: Helmut Markert, Nürnberg; Peter Donner, Hemhofen; Klaus Kretzschmar, Erlangen; Klaus Müller, Regensburg; Michael Schreyer, Weisendorf, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/367,273

(22) PCT Filed: Jul. 2, 1993

(86) PCT No.: PCT/DE93/00584

§ 371 Date: May 9, 1995

§ 102(e) Date: May 9, 1995

(87) PCT Pub. No.: WO94/02528

PCT Pub. Date: Feb. 3, 1994

(30) Foreign Application Priority Data

Jul. 17, 1992 (DE) .................................................. 42 23 632

(51) Int. Cl.⁷ .............................. C08K 3/22; C08K 3/36; C08L 63/02; C08L 63/04
(52) U.S. Cl. ............................................. 523/427; 525/486
(58) Field of Search ..................................... 525/504, 524, 525/525, 526, 528, 534, 540, 486; 428/413, 423.1, 901; 528/51, 72, 73, 93, 98, 103, 119; 523/404, 415, 459, 427; 524/786, 858, 860, 868, 871

(56) References Cited

U.S. PATENT DOCUMENTS

| | | | |
|---|---|---|---|
| 3,028,251 | 4/1962 | Nagel | 117/21 |
| 3,334,110 * | 8/1967 | Schramm | 260/307 |
| 3,979,365 * | 9/1976 | Tanaka et al. | 260/77.5 |
| 4,401,499 * | 8/1983 | Kaneko et al. | 525/407 |
| 4,562,227 * | 12/1985 | Rogler et al. | 524/786 |
| 4,564,651 | 1/1986 | Markert et al. | 524/589 |
| 4,576,768 * | 3/1986 | Markert et al. | 264/27 |
| 4,631,306 | 12/1986 | Markert et al. | 523/457 |
| 4,658,007 * | 4/1987 | Marks et al. | 528/73 |
| 4,762,900 * | 8/1988 | Velasco et al. | 528/73 |
| 4,906,722 * | 3/1990 | Eldin et al. | 528/73 |
| 5,036,135 * | 7/1991 | Von Gentzkow et al. | 528/72 |
| 5,112,932 | 5/1992 | Koenig et al. | 528/51 |

FOREIGN PATENT DOCUMENTS

| | | |
|---|---|---|
| 0 113 575 | 7/1984 | (EP) . |
| 0 296 450 | 12/1988 | (EP) . |
| 50-059499 | 5/1975 | (JP) . |
| 51-128400 | 11/1976 | (JP) . |
| 61-181820 | 8/1986 | (JP) . |

OTHER PUBLICATIONS

Markert, H. et al., "Network Polymers Based on EPIC Resins," *8173 Siemens Forschungs—und Entwicklungsberichte*, vol. 16 (1987), No. 3, Berlin, W. Germany, pp. 105–111.

Patent Abstracts of Japan, vol. 11, No. 3, Jan. 7, 1987.

Bruins, "Epoxy Resin Technology," Interscience Publishers, New York, New York, pp. 31–36 and 194, 1968.*

* cited by examiner

Primary Examiner—Robert E. L. Sellers
(74) Attorney, Agent, or Firm—Kenyon & Kenyon

(57) ABSTRACT

In a process for the production of a flame-resistant, pourable, latently reactive, phenolically curable epoxy resin molding material for the encapsulating of electronic components, a latently reactive prepolymer epoxy resin mixture in powder form which is free of isocyanate groups is produced at reaction temperatures up to 200° C. from a thermally polymerizable, filler-containing reaction resin mixture of polyepoxy resin consisting of a mixture of bi-functional and multi-functional epoxy resins and polyisocyanate resin having a molar ratio of the epoxy groups to the isocyanate groups of >1:1 with a substituted imidazole as reaction accelerator in a concentration of 0.5 to 2.5% by weight, relative to polyepoxy resin, and the prepolymer epoxy resin mixture is mixed with a powdered filler-containing phenolic resin mixture in a molar ratio of the epoxy groups to the phenolic hydroxyl groups of 1:0.4 to 1:1.1.

11 Claims, No Drawings

BLENDING EPOXY RESIN-POLYISOCYANATE-FILLER MIXTURE AND PHENOLIC RESIN-FILLER MIXTURE FOR MOLDING

BACKGROUND OF THE INVENTION

1. Field of the Invention

The present invention relates to a process for producing a flame-resistant, pourable, latently reactive, phenolicly curable epoxy resin molding material for encapsulating electronics components.

2. Description of Related Art

In electronics, filler-containing molding materials having a base of epoxy resins are used for the encapsulating of active and passive components. Examples of such uses are the encapsulating of capacitors, diodes, transistors, power semiconductors, optocouplers, storage chips, and microprocessors. Epoxy resin molding materials which are suitable for this purpose must satisfy high demands with regard to their processing properties and the properties of the molded articles (i.e. molded materials, or moldings). This is true, in particular, of the purity of the molding materials, as well as their rheological behavior and their curing properties upon processing as transfer molding materials by transfer molding processes and furthermore the mechanical-thermal properties of the epoxy resin molded materials and long-term stable protection of the components from corrosive environmental influences. Furthermore, the epoxy resin molded materials must satisfy the high requirements of electronics as to their non-inflammability and—in the internationally customary flammability test in accordance with UL 94—reach a grade of V-O in a layer thickness $\leq 1.6$ mm.

The curing of epoxy resin molding materials can be effected with chemically different hardener components, for instance with carboxylic acid anhydrides, amines or phenols. For the encapsulating of electronic components by transfer molding processes, phenolicly curable epoxy resin transfer molding materials which have a high filling of silanized ground fused quartz (i.e. synthetic silica flour) have, however, gained popularity.

Phenolicly curable epoxy resin transfer molding materials generally contain 20 to 30% organic substances and 70 to 80% inorganic substances. The chemical basis of the resin components consists, in most cases, of cresol novolak epoxy resins. For the curing of the epoxy resins, phenol novolaks are predominantly used; the accelerating of the reaction is effect, for instance, with triphenyl-phosphine, phenylphosphonium borate and 2-ethyl-4-methyl imidazole. In order to improve the low-stress behavior, silicone-modified epoxy resin components are used. The flame resistance of the molding materials is obtained by means of aromatic bromine compounds, particularly tetrabromobisphenol A epoxy resins, which are chemically incorporated in the epoxy resin molding upon the curing. In addition, antimony trioxide is used as synergist and increases the effectiveness of the brominated fire-retarding agents. The flame-resistant properties of the epoxy resin moldings are furthermore supported by a high content of silanized fused-quartz fillers; in this connection, both angular (i.e. splintery) fillers and mixtures of angular and spherical fillers are used. Recently, in order to avoid so-called soft errors in highly integrated circuits, synthetically produced α-radiation-free fused quartz fillers have been used. The high content of silanized fused quartz filler also serves to improve the mechanical-thermal properties of the epoxy resin moldings, in particular for adjusting the coefficient of expansion. The molding materials further-more also contain small quantities of additives, in particular carbon black and processing aids such as stearates and waxes.

For the production of the phenolicly curable epoxy resin transfer molding materials, the resin and hardener components are, as a rule, brought into a prereacted state (B-stage) at temperatures of up to about 120° C., in particular by kneading on a cylinder mill or by extrusion, for instance by means of a screw kneader, and pulverized. For the processing of the transfer molding materials by transfer molding processes, the powdered molding material is generally tabletted and the tablets are possibly preheated to 80 to 90° C. The encapsulating of the components is generally effected with temperatures of the mold of 170 to 190° C. and with a pressure of 70 to 200 bar, the molding material being cured in the mold generally for 60 to 120 sec. Thereupon, the components are removed from the mold and, as a rule, after-cured at temperatures of 170 to 190° C.

The phenolically curable epoxy resin molding materials which have been made flame-resistant with bromine-containing flame-retarding agents and antimony trioxide, which materials have excellent flame-inhibiting properties, have proven popular in electronics. Due to the poor compatibility of the brominated aromatic compounds with the environment, however, the replacement of such epoxy resin molding materials is being increasingly called for. The reasons for this are that, in case of disturbance, i.e. upon fire or carbonizing, these compounds spslit off highly corrosive brominated gases and form biologically difficultly degradable brominated decomposition products of high toxicological-ecological potential for danger. Furthermore epoxy resin moldings which contain brominated flame-retarding agents are not suitable for recycling if a further dispersion of dangerous products is to be avoided. Furthermore, in the future, such epoxy resin moldings cannot be disposed of by burning in view of the increasingly stringent regulations as to the purity of the air, but only as special refuse, with technically expensive and economically unprofitable methods of burning. The use of antimony trioxide is objectionable inasmuch as that compound is included in the list of dangerous carcinogenic substances. The danger is negligible, to be sure, in the case of permanent retention, but in case of fire or carbonization, or in recycling processes, antimony trioxide which has been liberated—in the form of an inhalable dust—represents a high risk.

SUMMARY OF THE INVENTION

The object of the present invention is to provide a method of producing halogen-free molding materials having a base of epoxy resins which satisfy the demands made by electronics on the flame-resistant behavior and, at the same time, satisfy the high demands made on the processing properties and the properties of the molded articles. In addition, these molding materials should have environmentally friendly properties, be suitable for recycling and be disposable by methods of combustion which protect the environment and provide for the recovery of energy.

This is achieved, in accordance with the invention, in the manner that a latently reactive, prepolymer epoxy resin mixture in powder form with no isocyanate groups is produced from a filler-containing, thermally polymerizable reaction resin mixture of polyepoxy resin, consisting of a mixture of difunctional epoxy resins, and polyisocyanate resin, with a molar ratio of the epoxy groups to the isocyanate groups of >1:1, with the use of a substituted imidazole as a reaction accelerator in a concentration of 0.5 to 2.5% by weight, referred to polyepoxy resin, at reaction temperatures of up to 200° C., and that the prepolymer epoxy resin mixture is mixed with a powdered, filler-containing phenolic resin mixture in a molar ratio of the epoxy groups to the phenolic hydroxyl groups of 1:0.4 to 1:1.1, possibly with the use of additives.

DETAILED DESCRIPTION OF THE INVENTION

In the process of the invention, the prepolymer epoxy resin mixture can be prepared in various ways. In a first variant, polyepoxy resin, i.e. difunctional epoxy resins, and polyisocyanate resin, as well as possibly additives, are heated to temperatures of up to 100° C. in a thermostatically controllable and evacuatable mixing container (as preparation and reaction vessel) which is provided, for instance, with a high power agitator (with duplex kneading blades) and permits of continuous measurement of the temperature, and mixed and degassed with agitation. Filler material, and possibly other additives, are added portion-wise into the reaction resin mixture, and degassing is then effected for at least 1 hour, with agitation, at temperatures up to 100° C. Thereupon, the reaction accelerator is added and the reaction resin mixture degassed, with agitation. The temperature of the mixing container is then brought to 160 to 180° C. The reaction for the forming of the prepolymer epoxy resin mixture starts, as a rule, at a temperature within the resin mixture of 130° C. Depending on the chemical structure of the polyepoxy and polyisocyanate resins and the molar ratio, and depending on the nature and concentration of the accelerator, the reaction temperature can rise briefly to 200° C.

The reaction, which is controlled in temperature and time, is interrupted when the prepolymer epoxy resin mixture is present. The interruption is effected by cooling the prepolymer epoxy resin mixture to temperatures below 50° C. In preliminary tests, the conversion of the epoxy groups is established, which—depending on the molar ratio of the epoxy and isocyanate groups introduced—should be present at the time of the interruption of the reaction. Important criteria for the interruption of the polymerization reaction are the melting range and the viscosity of the prepolymer epoxy resin mixture. It is determined by IR spectroscopy that no isocyanate groups are present any longer in the prepolymer epoxy resin mixture.

The latently reactive prepolymer epoxy resin mixture which is free of isocyanate groups which has been obtained in the above reaction is then pulverized, which can be done in the manner that it is ground in an impact mill at room temperature. The powdered epoxy resin mixture is then stored, protected from moisture.

In a second variant, polyepoxy and polyisocyanate resins are mixed (for the preparation of a resin component) at temperatures of up to 100° C., with agitation, in a thermostatically controllable, evacuatable mixing container which is provided, for instance, with a helical ribbon impeller and permits a continuous measurement of temperature in the resin mixture. Filler and possibly additives are introduced into this resin mixture, whereupon it is degassed for at least 1 hour, with agitation, at a temperature of up to 100° C. The reaction accelerator is dissolved or dispersed in a second mixing container—for the production of an acceleration component—in one of the resin components provided for in the recipe or in a partial amount thereof, with degassing. The two components are then fed by metering pumps, for instance by means of a heatable hose pump or a gear pump, to a static mixing tube, and the reaction resin mixture which emerges from the mixing tube is introduced into a continuously operating reactor.

As reactor, a double-screw extruder is particularly suitable. In this connection, it is advantageous if the ratio of the length of the screw to the outer diameter of the screw of the extruder is 20 to 50 and, in particular, 25 to 40. In addition, the extruder is preferably so designed that, with screw speeds of rotation of >10 rpm, the dwell time of the material is less than 5 min, and preferably less than 3 min, and that there is minimal axial return flow.

The extruder to which amounts of resin of 20 to 200 g/min are continuously fed, contains conveyor-active screw elements (screw diameter, for instance, 31.8 mm, screw length 880 mm) and is provided with five thermostatically controllable cylindrical zones which are heated, for instance, to 160 to 180° C.; the screw rotates with a speed of 15 to 30 rpm. In this way, there is a dwell time in the reactor of less than 3 min for the conversion of the reaction resin mixture into the prepolymer epoxy resin mixture. The extruded product which emerges through a slot die is conducted over a cooled slide rail and cooled rapidly to temperatures below 50° C., the epoxy resin mixture solidifying to form ribbon-shaped endless strips. These strips are pulled under a roller on a withdrawal belt and thereby coarsely crushed. The pre-crushed product is ground in an impact mill to the desired particle size. The pourable, storable, soluble or fusible, latently reactive prepolymer epoxy resin mixture prepared in this way is stored, protected from moisture.

In a third variant, the preparation of the resin component is effected in the same way as in the second case. In order to prepare the accelerator component, the reaction accelerator is intensively mixed with a part of the filler material stipulated in the recipe. The two components are then introduced, for instance by means of a hose pump or a twin-screw powder-metering device into a twin-screw extruder. Differing from the second variant, the screws in this case are provided with conveying-active kneading elements in the mixing zone of the extruder which adjoins the feed region; the temperature in the mixing zone is up to 100° C. The further construction of the extruder and the process conditions correspond substantially to Variant 2.

In a fourth variant, a storable, pourable, insoluble reaction resin powder which is free of isocyanate groups is first of all prepared. This powdered reaction resin is then converted by means of a continuously operating reactor into the prepolymer epoxy resin mixture. For the preparation of the reaction resin powder, an accelerator-containing reaction resin mixture is prepared in a mixing container, in the same way as in the first case. The temperature of the mixing container is then brought to 160 to 180° C. The conversion of the reaction resin mixture to the insoluble reaction resin powder which is free of isocyanate groups takes place, as a rule, as from reaction temperatures of 130° C. within a few minutes, a pourable product being produced by agitation in the mixing container. In order to interrupt the reaction, the temperature of the mixing container is rapidly lowered by means of a cooling thermostat and the reaction resin powder is brought, with agitation, to temperatures below 50° C. The conversion of the epoxy groups which is to be present at the time of the interruption of the reaction is established in preliminary tests. It is determined by IR spectroscopy that no further isocyanate groups are present in the reaction resin powder. The insoluble reaction resin powder, free of isocyanate groups which is obtained in this manner, can, if necessary, be provisionally stored for a long time and then be converted under conditions comparable to those used in the second case into the prepolymer epoxy resin mixture in a continuously operating reactor.

In the process of the invention, the prepolymer epoxy resin mixture is cured with a powdered filler-containing phenolic resin mixture. For the production of this phenolic resin mixture, the mixing container which has been described above is, for instance, well-suited. In this connection, a phenolic resin or a mixture of phenolic resins is melted and heated, with agitation, to temperatures of up to 160° C. The filler is then added, in portions, to the phenolic resin and the mixture is degassed with agitation. The phenolic resin mixture is then cooled to room temperature, ground in an impact mill, and stored at room temperature, protected from moisture.

For the preparation of the flame-resistant, pourable, latently reactive, phenolicly curable epoxy resin molding material, the powdered prepolymer epoxy resin mixture and the powdered phenolic resin mixture are mixed in a molar ratio of the phenolic hydroxyl groups to the epoxy groups of 0.4:1 to 1.1:1; the molar ratio is preferably 0.6:1 to 1.0:1. This can possibly be effected with the addition of additives. For the mixing of the components, which is effected at room temperature, a frustoconical mixer with helical ribbon impeller can, for instance, be used. The mixing of the components can advantageously also be effected in a twin-screw extruder which—as described above—has conveyor-active kneading elements in addition of conveyor-active screw elements, for instance at temperatures of 90 to 95° C.; the extruded product is then cooled and pulverized. The pourable epoxy resin molding material obtained in the manner described is stored at room temperature, protected from moisture.

The encapsulating of electronic components with the epoxy resin molding material of the invention is generally effected as follows. The pourable epoxy resin molding material is compressed at room temperature to form tablets and the tablets are heated by high-frequency heating to temperatures of up to 100° C. The electronic components are encapsulated with the heated molding material in the transfer molding process at mold temperatures of 170 to 190° C. and a pressure of 70 to 200 bar, and the molding material is then cured in the mold for 60 to 120 sec. Thereupon, the components are removed from the mold and possibly subjected to an after-curing of the encapsulation at temperatures of up to 200° C. As an alternative to the tabletting and preheating with high-frequency heating, the pulverized epoxy resin molding material can be compressed in a plasticizer at temperatures of up to 100° C. Under the same temperature and molding conditions as upon the encapsulation of the components there is furthermore also effected the production of test pieces, such as plates and bars, for the determination of the properties of the moldings of the phenolicly cured epoxy resin molding material.

In the process of the invention, a reaction resin mixture of polyepoxy and polyisocyanate resins is used, the polyepoxy resin being a mixture of difunctional and multi-functional epoxy resins. In this connection, the molar ratio of multi-functional to bi-functional epoxy resins, referred to the epoxy groups, is 0.1:1 to 1.7:1, and preferably 0.2:1 to 0.75:1. The molar ratio of the epoxy groups to the isocyanate groups (in the reaction resin mixture) is >1:1, and preferably 1.5:1 to 4.0:1.

A epoxy resins which are a component of the polyepoxy resin mixture there are suitable for the process of the invention, in particular, bisphenol A and bisphenol F epoxy resins, as well as phenol novolak and cresol novolak epoxy resins and silicone epoxy resins, triglycidyl isocyanurate, tetraglycidyl diaminodiphenyl methane, and polyglycidyl phosphorus resins. As silicone epoxy resins, compounds of the following structure are, in particular, used:

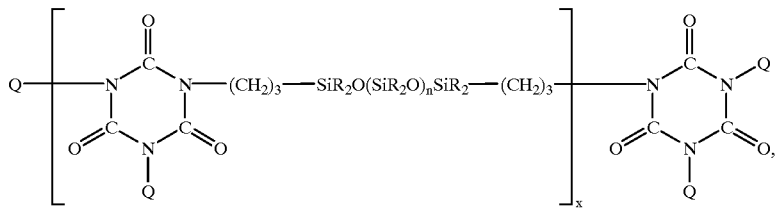

in which:

n is a whole number from 0 to 25, x is a whole number from 0 to 3,

R is alkyl or aryl,

Q is —$(CH_2)_3SiR_2O(SiR_2O)_nSiR_2R'$, in which n and R have the meaning as indicated above and R' is an epoxy-functional radical having 6 C atoms. The content of silicone epoxy resin is up to 20% by weight, and preferably 1 to 7% by weight, in each case referred to the filler-free reaction resin mixture of polyepoxy and polyisocyanate resins.

As polyisocyanate resin, isomer mixtures of diisocyanatodiphenyl methane are preferably employed.

However, there are also suitable, for instance, isomer mixtures of toluylene diisocyanate and prepolymers of isomer mixtures of diisocyanatodiphenyl methane. Mixtures of these polyisocyanate resins can furthermore be used.

As reaction accelerator, substituted imidazoles are used in the process of the invention. For this, 2-ethyl-4-methylimidazole, 2-phenylimidazole and 1-cyanoethyl-2-phenylimidazole are preferred. Other suitable reaction accelerators are, for instance, 1,2-dimethylimidazole, 1-cyanoethyl-2-methylimidazole, 2-isopropylimidazole, and 1-benzyl-2-phenylimidazole. The content of reaction accelerator referred to polyepoxy resin, i.e. to the mixture of the bi- and multi-functional epoxy resins, is 0.5 to 2.5% by weight, and preferably 1.0 to 1.8% by weight.

As phenolic resin there are suitable, in particular, phenol and cresol novolak resins, individually or in mixture. The phenolic resin mixtures may also contain prepolymers of novolak resins and silicone elastomers (silicone-modified phenolic resins) or mixtures of phenolic resins and phosphine oxides.

As fillers, mineral fillers are, in particular, suitable, such as fused quartz in angular and/or spherical particle shape (different particle-size distribution), preferably with a particle size ≦100 μm. Furthermore, ceramic fillers such as aluminum oxide, as well as mixtures of ceramic fillers and mineral fillers can be used. Fibrous fillers are also suitable, such as, for instance, short, glass fibers.

In order to reduce the tool wear upon the production and the wear of the mold upon the processing, as well as in order to improve the mold-removal properties, additives can be added in small amounts to the epoxy resin molding material. For this, there are suitable, preferably, the chemically incorporatable glycerol monostearate, as well as waxes such as carnauba wax, micronized polyethylene, polyamide, and polytetra-fluoroethylene. The additives are added to the reaction resin mixture of polyepoxy and polyisocyanate resins upon the production of the prepolymer epoxy resin mixture and/or the phenolic resin mixture, or, like micronized thermoplasts, admixed upon the mixing of the prepolymer epoxy resin mixture with the phenolic resin mixture. In order to reduce wear, spherical fused quartz filler can furthermore be used.

A process for the production of the flame-resistant epoxy resin molding materials of the invention has not yet been described. It is known, however, that molding materials of polyepoxy resins and polyisocyanate resins can be cured with the use of reaction accelerators. The molding materials are mixed for this purpose, for instance at temperatures of 80° C., on a cylinder mill and cured directly into molded articles at temperatures of up to 180° C. (see JP-OS 50-059499 and JP-OS 51-128400).

Furthermore, thermally self-curable casting resin mixtures of polyepoxy resins and polyisocyanate resins are known (see EP Patent 0 129 787 and EP Patent 0 130 454). In this case also, the purpose is to produce the cured molded article directly from the reaction resin mixtures of polyepoxy resin and polyisocyanate resin.

In the first case (EP Patent 0 129 787), which is a process for the production of molded articles for insulating components from fast-curing reaction resins which can be processed in a manner similar to injection molding, liquid mixtures (of a viscosity of up to 7000 mPa●s at 25° C.) of substantially oxazolidinone-free polyepoxides and of polyisocyanates (EP/IC resins)—in a batch molar ratio of epoxy groups to isocyanate groups of 1:5—are cross-linked by tertiary amines or imidazoles as curing catalysts at gelation temperatures of more than 130° up to 150° C. under a pressure of between 1 and 10 bar and after-cured at temperatures of 150 to 200° C. (with the formation of reaction resin molded articles containing oxazolidinone and isocyanurate rings, so-called OX/ICR molded materials), the reaction conditions being so selected that more than 90% of the epoxy and isocyanate groups are converted and that the molar ratio of the oxalidinone and isocyanurate rings (OX:ICR) in the molding is more than 1.

In the second case (EP Patent 0 130 454), a process for the production of reaction resin moldings (OX/ICR molded materials) containing oxazolidinone (OX) and isocyanurate rings (ICR) in which mixtures of substantially OX-free polyepoxides and polyisocyanates (EP/IC resins) are gelled in the presence of a curing catalyst at temperatures of up to 130° C. and then after-cured until more than 90% of the epoxy and isocyanate groups have reacted, solvent-free liquid mixtures of polyepoxides and polyisocyanates (with a viscosity of up to 7000 mPa●s at 25° C.) are used in a batch molar ratio of the epoxy and isocyanate groups of 1 to 5, tertiary amines or imidazoles are employed as catalysts, and the reaction conditions are so selected that the molar ratio of the oxazolidinone and isocyanurate rings (OX:ICR) in the molding is between 1:1 and 5.7:1, i.e. >1:1.

The process of the invention differs from the processes described above, both in its object and in its manner of procedure. In it, namely, cured molded articles are not to be produced but, rather, fusible, latently reactive prepolymer epoxy resin mixtures which are cured with phenolic resin mixtures—with shaping by the transfer molded process—to form flame-resistant molded materials and which—without the use of halogen-containing flame-inhibiting agents and antimony trioxide—satisfy the requirements made by electronics on burning behavior in accordance with UL 94 V-O, for a layer thickness of 1.6 mm.

From WO 90/15089, it is known to produce epoxy-terminated polyoxazolidinones (there simply referred to as polyoxazolidones) by reacting a polyepoxy compound with a polyisocyanate compound at elevated temperature in the presence of a catalyst. For this, 5 to 30% by weight of the polyisocyanate compound is added within the course of 30 to 90 min to a mixture of 70 to 95% by weight of the polyepoxy compound and 0.01 to 2% by weight of the catalyst, and the reaction mixture thereby obtained is then heated for 5 to 180 minutes at a temperature of 110 to 200° C. The process is carried out—with control of various process parameters—in the manner that in the resultant epoxy-terminated polyoxazolidinone, which is also known as isocyanate-modified epoxy resin, 50 to 100% of the original isocyanate groups are converted to oxazolidinone rings and 0 to 50% to isocyanurate rings.

The known process uses, as polyepoxy compound, in particular bisphenol A and tetrabromobisphenol A, the polyisocyanate compound is 4,4,'-methylene-bis(phenylisocyanate) (MDI) or an isomer thereof, polymeric MDI or toluylene diisocyanate. As catalyst (for the reaction between the polyepoxy and polyisocyanate compounds) there is suitable, in particular, an imidazole compound or tetraphenyl phosphonium bromide; the catalyst concentration is preferably 0.02 to 1% by weight, and in particular 0.02 to 0.1% by weight, referred to the total weight of polyepoxy and polyisocyanate compounds.

For the production of the polyoxazolidinones, one proceeds in the manner that the catalyst, possibly dissolved in a suitable solvent, is added to the polyepoxy compound, in general, at a temperature below the reaction temperature of 110 to 200° C. The temperature is then raised to the reaction temperature and kept there while the polyisocyanate compound is added in controlled fashion, i.e. added drop by drop.

In similar manner, in a process known from EP 0 296 450 A1 for the production of oligomeric polyepoxides containing oxazolidinone groups (there referred to simply as oxazolidone groups), one starts from bisepoxides and diisocyanates. In this process—at 140 to 180° C. in the presence of a phosphonium salt as catalyst—either bisepoxyethers having OH groups corresponding to a hydroxyl number of at least 2 are reacted with aromatic diisocyanates which have two differently reactive NCO groups in an amount of at least one quarter of the weight of the diisocyanate, or bisepoxide esters having OH groups corresponding a hydroxyl number of at least 2 are reacted with aromatic, aliphatic or cycloaliphatic diisocyanates in a quantity ratio of NCO group to epoxy groups of 1:1.4 to 1:2.5. The catalyst is used in this connection in an amount of 0.005 to 1.0% by weight, and preferably 0.01 to 0.5% by weight, referred to bisepoxide.

It is essential in connection with this process that the oxazolidinone epoxy resins are only obtained when epoxy resins which contain OH groups are caused to react together with diisocyanates which contain differently reactive NCO groups—with catalysis by phosphonium salt—at about 160° C. For the production of the polyepoxides, one proceeds in this connection in the manner that the bisepoxy resin is heated together with the catalyst under nitrogen to a temperature of 160° C. The diisocyanate is then added, drop by drop, to the melt so rapidly that a temperature of about 170° C. is maintained. After the addition of all of the diisocyanate, further agitation is effected at 160° C. until the calculated epoxide value is reached and no reactive NCO can be detected any longer.

The production of epoxy-terminated poly-oxazolidinones or of polyepoxides containing oxazolidinone groups which has been described in the two publications mentioned above differs both in the manner of procedure for the preparation of the accelerator-containing reaction resin mixture (from polyepoxy resins and polyisocyanate resins) and in the composition of the reaction resin mixture fundamentally from the method of the present invention for the production of a latently reactive prepolymer epoxy resin mixture. Thus, in the prior art, as can be noted in particular from the examples, small concentrations of catalyst are used, namely 0.01 to 0.35% (WO 90/15089) and 0.1% (EP 0 296 450 A1), in each case referred to polyepoxide. For the preparation of the reactive, curable prepolymer epoxy resin mixture, substantially larger amounts of catalyst are, however, required. In the process of the invention, the catalyst concentration is therefore 0.5 to 2.5% by weight, and preferably 1.0 to 1.8% by weight, referred to the mixture of the bi- and multi-functional epoxy resins. These high catalyst concentrations are necessary so that the latently reactive, prepolymer epoxy resin mixture can be cured in a industrially feasible time without post-acceleration—which is expensive in the case of filler-containing systems.

The use of such large amounts of catalyst is, however, only possible if one proceeds in accordance with the process of the present invention, in which a complete reaction resin mixture consisting of a mixture of bi- and multi-functional epoxy resins, polyisocyanate resin, and filler is prepared with the use of imidazoles of the kind indicated at temperatures of up to 100° C. and the latently reactive prepolymer epoxy resin mixture is prepared with this mixture at reaction temperatures of up to 200° C. However, it has been found that with such a high catalyst concentration, it is not possible to heat the epoxy resin mixture of the invention (as in the prior art) to temperatures of up to 170° C., add the reaction accelerator, and introduce the polyisocyanate resin, since in this way gelled or cured products are produced rather than soluble, fusible, latently reactive prepolymer epoxy resin mixtures.

The process of the invention also differs in the composition of the reaction resin mixture (from polyepoxy resin and polyisocyanate resin) fundamentally from the reaction resin mixtures known from the prior art (WO 90/15089 and EP 0 296 450 A1). On the one hand, the reaction resin mixtures of the invention are highly filled mixtures which, due to their high viscosity, are generally solid at room temperature and other conditions are necessary for the preparation and handling of them than for unfilled reaction mixtures. On the other hand, for the production of these highly filled reaction resin mixtures, mixtures of bi-functional and multi-functional epoxy resins are used, for instance of bisphenol A epoxy resins with tetrafunctional epoxy resins, such as tetraglycidyl diaminodiphenylmethane and silicone epoxy resins. Such mixtures, however, are not known from the prior art. Furthermore, neither the particularly suitable reaction accelerator 1-cyanoethyl-2-phenylimidazole nor the silicone epoxy resins (important for the processing properties) and the tetraglycidyl diaminodiphenylmethane (particularly suitable in order to increase the glass transition temperature) are mentioned in it.

It was entirely surprising and unpredictable for the person skilled in the art that in the process of the invention upon the production of the prepolymer epoxy resin mixture, the use of multi-functional epoxy resins, such as tetraglycidyl diaminodiphenylmethane and the said silicone epoxy resins, as well as the use of high accelerator concentrations, even at reaction temperatures up to 200° C., does not lead to a curing, i.e. chemical cross-linking of the reaction resin mixture of polyepoxy and polyisocyanate resins but to a storable, soluble or fusible, latently reactive prepolymer epoxy resin mixture which can be cured excellently without after-acceleration.

It was furthermore found that both the prepolymer epoxy resin mixture and the phenolicly curable epoxy resin molding material prepared with it have excellent latent reactivity; furthermore, as will be shown later on (see Table 4), they have an excellent shelf life. It is also a particular advantage that the latent reactivity of the phenolicly curable epoxy resin molding material can be adjusted in targeted manner to its purpose of use, via the concentration (and also the nature) of the reaction accelerator (in the reaction resin mixture of polyepoxy and polyisocyanate resins), without the shelf life being limited thereby (see, in this connection, also Table 5). Therefore, no expensive post-acceleration is necessary in order to increase the reactivity of the epoxy resin molding material. The latent reactivity of the phenolicly curable epoxy resin molding material can furthermore also be varied by means of the molar ratio of the phenolic hydroxyl groups to the epoxide groups (see Table 6).

One possibility for adjusting the reactivity of the phenolicly curable epoxy resin molding material consists also in the use as hardener component of a phenolic resin mixture containing a reaction accelerator. In this way, an epoxy resin molding material which has a very high curing speed can be produced, without its stability upon storage being impaired thereby. As such reaction accelerator, there can preferably be used a substituted imidazole such as 1-cyanoethyl-2-phenylimidazole and 2-phenylimidazole, or triphenylphosphine. The content of reaction accelerator in the phenolic resin mixture is 0.5 to 1.5% by weight, and preferably 0.8 to 1.2% by weight, referred to the phenolic resin.

The flammability test in accordance with UL 94 shows that the moldings produced from the epoxy resin molding material of the invention reach the classification of V-O required for electronics with a layer thickness $\leq 1.6$ mm. This is surprising since epoxy resin moldings produced on a basis of cresol novolak epoxy resins and phenolic resins (as hardener) which contain the filler fused quartz in the same concentration as the epoxy resin molding material of the invention, reach no classification in accordance with UL 94 V-O in a layer thickness of 1.6 mm without the use of brominated flame-retarding agents and antimony trioxide; rather, the test specimens burn completely.

The use of silicone epoxy resins has proven particularly advantageous in the process of the invention, both for the production and processing of the phenolicly curable epoxy resin molding material and for the properties of the moldings. Thus, upon the production of the prepolymer epoxy resin mixture, a gentle grinding upon the pulverization is made possible and, upon the processing of the epoxy resin molding material, the flow behavior upon the shaping and the mold-removal properties of the encapsulated electronic components are improved. For example, the spiral flow length, which represents a measure of the flowability of transfer molding materials under pressure and temperature is clearly improved by the use of the silicone epoxy resins and is increased by up to 20%. By means of the chemical structure and the content of silicone epoxy resins, the adherence properties of the phenolicly curable epoxy resin molding material can, furthermore, be adapted to different substrates. This is of particular importance for adherence to the system supports (lead frames) consisting of alloys of electronic components. In the flammability testing of the epoxy resin molded materials in accordance with UL 94, it is found that even small additions of silicone epoxy resin improve the flame-resistant behavior.

Epoxy resin molded materials which are to be suitable for the covering and encapsulating of electronic components must have excellent mechanical-thermal properties and must not cause any mechanical-thermal stress even under extreme test conditions, such as cyclic temperature loading with 1000 temperature cycles from −65 to +150° C., which lead to failure of components. The stress behavior of the epoxy resin molded materials is dependent, in particular, on the glass transition temperature, the coefficient of linear thermal expansion, and the modulus of elasticity. It has been found that, with the epoxy resin molding materials of the invention, mechanical-thermal properties of the moldings are obtained which satisfy the requirements for the encapsulating of electronic components (see Tables 7 and 8). It proved of particular advantage in this connection that, for the production of the epoxy resin mixtures, mixtures of bi-functional and multi-functional epoxy resins are used. With these mixtures, the glass transition temperature of the epoxy resin moldings can namely be clearly increased without the modulus of elasticity and the coefficient of linear expansion being detrimentally affected. Thus, as will be shown later on (see Table 7), glass transition temperatures of >150° C. are obtained with the epoxy resin molded materials of the invention. On the other hand, if exclusively bi-functional epoxy resins are used, this is not possible. In that case, namely, only glass transition temperatures within the range of 135 to 140° C. are obtained.

Upon a comparison of the processing conditions of the epoxy resin molding material of the invention and essential properties of the moldings with a molding material and a molding in accordance with the prior art, it is also found that, by means of the epoxy resin molding material of the invention, the demanding requirements of electronics as to the processing properties and properties of the moldings are satisfied (see Table 9). As comparison there was employed in this connection the molding material Nitto HC 10/2 which is used throughout the world. This molding material is a phenolically curable cresol novolak epoxy resin molding material which contains 70% by weight angular fused quartz as filler and has its flame-resistance adjusted with tetrabromo-bisphenol A epoxy resin as well as antimony trioxide as synergist.

Furthermore, the epoxy resin moldings in accordance with the invention, due to their environment-friendly properties, satisfy further important requirements of electronics for their future use. This concerns, in particular, the suitability of the moldings for an environment-friendly recycling and an environment-compatible disposal by burning. The environmental compatibility of the halogen-free flame-resistant epoxy resin moldings as compared with the prior art is proven by the fact that—in contradistinction to epoxy resin moldings with brominated flame-retarding agents and antimony trioxide—upon combustion no highly corrosive gaseous cleavage products and no decomposition products of high toxicological-ecological potential of danger are formed. Upon the burning, for instance in accordance with DIN Method 53436, there are only found combustion products such as occur also with natural products such as wool, wood and coal. Assurance is thus had that, in case of a disturbance such as fire or carbonization, no contamination of the environment which goes beyond the normal case will result, and that the same procedure can be used for disposal by burning as in the case of ordinary household garbage.

The suitability for recycling of the moldings produced from the epoxy resin molding material of the invention is of particular importance for electronics since, upon the encapsulating of components by the transfer molding process, considerable amounts of epoxy resin moldings are produced as waste. Furthermore, in the future, the epoxy resin moldings from the electronic scrap are to be employed for further use after removal of the metals. The epoxy resin moldings offer good prerequisites for recycling since, on the one hand, they can be subjected to high mechanical-thermal loads and have excellent chemical resistance to corrosive chemicals and, on the other hand, they satisfy an important requirement (as compared with the prior art) namely they have environmentally friendly physical properties.

For the recycling of waste materials upon the transfer molding there is, in particular, the possibility of use as filler. The technically high-grade fillers can be used in electronics and electrical engineering in general as well as for other technologies, particularly the automobile industry, and for the thermoplastic and thermosetting materials necessary for this. However, they are also suitable for reuse for the encapsulating of electronic components; the waste materials are for this purpose ground to the required particle size. By the epoxy resin molding material of the invention there is thus available a covering and encapsulating material which is flame-resistant although halogen-free, which is suitable for electronics and environmentally friendly and which represents a substantial advance with regard to the symbiosis of technology and environment as compared with the prior art.

The invention will be further explained on the basis of examples:

EXAMPLE 1

Preparation of a Prepolymeric Epoxy Resin Mixture 255 g bisphenol A epoxy resin (epoxide value: 5.78 mole/kg), 16.5 g of a silicone epoxide (epoxide value: 1.9 mole/kg), prepared in accordance with the Example 9 of EP-OS 0 399 199, 82.5 g tetraglycidyl diaminodiphenyl methane (epoxide value: 8.2 mole/kg) and 90 g of an isomer mixture of diisocyanatodiphenylmethane (isocyanate value: 7.9 mole/kg) are introduced into a mixing container and then heated to 80° C., mixed and degassed with agitation. Thereupon, 724.5 g of spherical fused quartz, 310.5 g of angular fused quartz and 15 g of carbon black are added in separate portions with agitation to the mixture, whereupon degassing is effected for 1 hour at 80° C., with agitation. 5.55 g of 1-cyanoethyl-2-phenylimidazole are introduced into the reaction resin mixture, whereupon degassing is effected for 15 min, with agitation. The temperature of the mixing container is then brought to 180° C. and the reaction resin mixture is caused to react, with agitation. The course of the reaction is continuously monitored by temperature measurements. The reaction is interrupted 4 min after the reaction temperature of 130° C. has been reached in the resin mixture. For this purpose, the mixing container is rapidly cooled by means of a cooling thermostat and the resin mixture brought to a temperature of less than 50° C. At this time, no free isocyanate groups are present any longer and 40% of the epoxide groups used have reacted. The mass which solidifies upon the cooling is coarsely comminuted by the agitator of the mixing container. This mass is then ground at room temperature by an impact mill to a particle size of <200 μm. The pourable, latently reactive, prepolymer epoxy resin mixture 1 obtained thereby (epoxide value: 0.86 mole/kg; melting range: 75 to 95° C.) is stored at room temperature, protected from moisture.

EXAMPLE 2

Production of a Phenolic Resin Mixture 900 g of cresol novolak resin and 30 g of carbon black are introduced into a mixing container and the two components are heated, with agitation, to 160° C. With continuous agitation, degassing is then effected for 1.5 hours. Thereupon, 1450 g of spherical fused quartz and 620 g of angular fused quartz are introduced, in separate portions, into the phenolic resin mixture which has a temperature of 160° C. Thereupon, degassing is again effected, with agitation, for 1.5 hours. The mass, which solidifies upon the cooling, is coarsely comminuted by the agitator. This mass is then ground at room temperature by an impact mill to a particle size of less than 200 μm. The pourable phenolic resin mixture 2 obtained thereby (OH value: 2.35 mole/kg) is stored at room temperature, protected from moisture.

EXAMPLE 3

Production of a Phenolicly Curable

Epoxy Resin Molding Material 1000 g of the pourable prepolymer epoxy resin mixture of Example 1 and 282 g of the pourable phenolic resin mixture of Example 2, are mixed intensively at room temperature in a frustoconical mixer having a helical ribbon impeller. The pourable, latently reactive, phenolicly curable epoxy resin molding material 3 obtained thereby (epoxide value: 0.62 mole/kg; viscosity: 105 Pa•s at 162° C.; spiral flow length: 67 cm at 175° C.) which is flame-resistant is stored at room temperature, protected from moisture.

EXAMPLES 4 to 11

In a manner corresponding to Example 1; further prepolymer epoxy resin mixtures are prepared. The composition of the reaction resin mixtures which serve for the production of the epoxy resins 4 to 11 are set forth in Table 1a (values in parts by weight). The epoxide value and the melting range are indicated in Table 1b, as characteristic data of the prepolymer epoxy resin mixtures (4 to 11).

EXAMPLES 12 to 17

In a manner corresponding to Example 2, further phenolic resin mixtures are prepared. The composition of phenolic resin mixtures 12 to 17 is set forth in Table 2 (values in parts by weight).

EXAMPLES 18 to 29

Further phenolically curable epoxy resin molding materials are prepared in a manner corresponding to Example 3. The composition of epoxy resin molding materials 18 to 29 is given in Table 3.

Table 4 shows the epoxide value (EP value) and the viscosity as a function of the storage time for prepolymer epoxy resin mixture 1 as well as for phenolicly curable epoxy resin molding materials 3 and 19.

From Table 5 there can be noted—for the phenolicly curable epoxy resin molding material 19—the influence of the nature and concentration of the reaction accelerator on the course of the viscosity. The times indicated up to the increase by a factor of 10 of the initial viscosity (at 175° C.) show the breadth of variation in connection with the latently reactive adjustment of the epoxy resin molding materials of the invention.

From Table 6 there can be noted—for the phenolicly curable epoxy resin molding materials 3, 19, 20 and 21—the influence of the molar ratio of phenolic hydroxyl groups to epoxide groups (OH:EP) on the course of the viscosity. As can be noted from the times indicated until an increase by a factor of 10 of the initial viscosity (at 175° C.) the latent reactivity of the epoxy resin molding materials can be varied via the molar ratio OH:EP.

In Table 7 the conditions (temperature, time) upon the curing and after-curing of the epoxy resin molding materials 3, 18, 19, 22, 24, 25, 26, 28 and 29 are shown as well as the glass transition temperatures of the corresponding moldings.

Table 8 shows, for the moldings prepared from epoxy resin molding materials 3, 18, 19, 22, 25, 26, 28 and 29—in addition to the curing conditions—the coefficient of linear thermal expansion ($\alpha$) and the modulus of elasticity (E') as further examples of the mechanical-thermal properties.

Table 9 shows a comparison of flame-resistant EP moldings which were prepared from a commercial molding material and from an epoxy resin molding material of the invention, in each case by transfer molding. In this connection, there are indicated on the one hand the processing conditions of the molding materials and on the other hand the properties of the corresponding moldings. The commercial molding material is made flame-resistant by the addition of brominated fire-proofing agents and antimony trioxide, while the epoxy resin molding material 27 of the invention is flame-resistant without the use of halogen.

EXAMPLE 30

Production of a Prepolymer Epoxy Resin Mixture

In order to produce a resin component, 2.55 kg bisphenol A epoxy resin (epoxide value: 5.78 mole/kg), 0.155 kg of a silicone epoxide (epoxide value: 1.9 mole/kg) prepared in accordance with Example 9 of EP-OS 0 399 199, 0.81 kg tetraglycidyl diaminodiphenyl methane (epoxide value: 8.2 mole/kg) and 0.885 kg of an isomer mixture of diisocyanatodiphenyl methane (isocyanate value: 7.9 mole/kg) are introduced into a thermostatically controllable, evacuatable mixing container (useful content 20 L); the mixture is then heated, with agitation, to 60° C. Thereupon, 6.195 kg spherical fused quartz, 2.655 kg angular fused quartz, 0.075 kg polyethylene wax, and 0.135 kg of carbon black are added to the mixture in separate portions, with agitation. Degassing is then effected for 1 hour at 60° C., with agitation. For the production of an accelerator component, 1.05 kg of spherical fused quartz, 0.45 kg of angular fused quartz, 0.015 kg of carbon black, and 55.5 g of 1-cyanoethyl-2-phenylimidazole are homogeneously mixed. The resin component and the accelerator component are introduced simultaneously into a twin-screw extruder, the resin component by means of a hose pump and with a continuous mass flow of 0.042 kg/min, and the accelerator component by means of a twin-screw metering device (mass flow: 5 g/min). The screws of the extruder are formed of conveyor elements and three conveying kneading blocks of a length of 28 mm each are mounted directly behind the feed zone for the homogeneous mixing of the resin and accelerator components. The length of the screw is 880 mm and the outside diameter of the screw is 31.8 mm; the five cylinder zones of the extruder are set to the following temperatures: Zone 1 (mixing zone): 81° C., Zone 2: 130° C., Zone 3: 177° C., Zone 4: 178° C., Zone 5: 180° C. The speed of rotation of the screw is 20 rpm, resulting in a dwell time in the twin-screw extruder of 2.5 min.

The extruded product which emerges from a twin-slot die (cross section: 2 mm×20 mm each) is guided on a cooled slide rail, cooled to 430° C., and comminuted by a roller on a connected elastic roll belt. The precomminuted extruded product is ground by an impact mill to the desired particle size. The pourable, latently reactive, curable prepolymer epoxy resin mixture 30 obtained thereby (epoxide value: 0.84 mole/kg; melting range 75 to 95° C.) is stored at room temperature, protected from moisture.

EXAMPLE 31

Production of a Prepolymer Epoxy Resin Mixture

A filler-containing reaction resin mixture is prepared in accordance with the manner described in Example 1. 5.55 g of 1-cyanoethyl-2-phenylimidazole are introduced into this reaction mixture, whereupon degassing with agitation is effected for 10 min. Thereupon, the reaction resin mixture is caused to react by heating the mixing container to 160° C. with further agitation; the course of the reaction is continuously monitored by temperature measurement. The reaction is interrupted 1 min after the solidification of the reaction resin mixture by cooling the mixing container with a cooling thermostat. In this connection, the temperature of the reaction resin mixture is brought—with continued agitation—to less than 50° C. By the continuous agitation, the insoluble reaction product which is free of isocyanate groups and has isocyanurate structures is obtained as a pourable powder of good shelf life. This reaction resin powder is fed to a twin-screw extruder via a vibratory trough with a continuous mass flow of 30 g/min. The length of the screw is 80 mm, the outside diameter of the screw is 31.8 mm; the five cylinder zones of the extruder are heated to 160° C. The speed of rotation of the screw is 90 rpm, whereby a dwell time in the extruder of 1.5 min is obtained.

The extruded product is discharged through a double-slot die (cross section: 2 mm×20 mm each), cooled to 45° C. by direct contact with a cooled slide rail, and comminuted by a roller on a connected elastic withdrawal belt. The material is then ground by means of an impact mill to a particle size of <200 μm. The pourable, latently reactive, curable prepolymer epoxy resin mixture 31 obtained thereby (epoxide value: 0.85 mole/kg; melting range: 75 to 95° C.) is stored at room temperature, protected from moisture.

EXAMPLE 32

Production of a Phenolicly Curable

Epoxy Resin Molding Material

A phenolically curable epoxy resin molding material 32 the composition of which is set forth in Table 3 is produced in the manner set forth in Example 3.

The conditions upon the curing and after-curing of the epoxy resin molding material 32 as well as the glass transition temperature of the corresponding molding are set forth in Table 7. The coefficient of linear thermal expansion and the modulus of elasticity are set forth alongside the curing conditions in Table 8.

TABLE 1a

| Example | 1 | 4 | 5 | 6 | 7 | 8 | 9 | 10 | 11 |
|---|---|---|---|---|---|---|---|---|---|
| Bisphenol A-epoxy resin | 17.0 | 15.1 | 13.0 | 15.8 | 15.3 | 16.4 | 15.6 | 17.5 | 16.8 |
| Silicone epoxy resin | 1.1 | 0.4 | 0.8 | 0.5 | 0.1 | 2.1 | 0.4 | — | 1.0 |
| Tetraglycidyldiamino-diphenylmethane | 5.5 | — | 4.5 | — | 5.0 | 5.3 | 5.1 | 5.7 | 5.4 |
| Cresol novolak epoxy resin | — | 8.7 | 3.7 | — | — | — | — | — | — |
| Triglycidyl iso-cyanurate | — | — | — | 2.5 | — | — | — | — | — |
| Diglycidylphenyl phosphonate | — | — | — | 1.4 | — | — | — | — | — |
| Isomer mixture of diphenylmethane - diisocyanate | 6.0 | 5.4 | 4.7 | 6.5 | 5.4 | 5.8 | 5.5 | 6.2 | 5.9 |
| 1-Cyanoethyl-2-phenylimidazole | 0.37 | 0.36 | 0.27 | — | 0.33 | 0.3 | 0.36 | 0.3 | 0.37 |
| 2-Phenylimidazole | — | — | — | 0.27 | — | — | — | — | — |
| Spher. fused quartz | 48.3 | 48.3 | 49.7 | 50.4 | 50.4 | 69.1 | 50.4 | 69.3 | — |
| Ang. fused quartz | 20.7 | 20.7 | 22.3 | 21.6 | 21.6 | — | 21.6 | — | — |
| Aluminum oxide | — | — | — | — | — | — | — | — | 69.0 |
| Carbon black | 1.0 | 1.0 | 1.0 | 1.0 | 1.0 | 1.0 | 1.0 | 1.0 | 1.0 |
| Glycerol monostearate | — | — | — | — | 0.9 | — | — | — | — |

TABLE 1b

| Example | Epoxide Value mole·kg$^{-1}$ | Melting Range ° C. |
|---|---|---|
| 1 | 0.86 | 75 to 95 |
| 4 | 0.73 | 82 to 98 |
| 5 | 0.93 | 77 to 93 |
| 6 | 0.85 | 76 to 94 |
| 7 | 0.72 | 81 to 95 |
| 8 | 0.88 | 74 to 89 |
| 9 | 0.77 | 79 to 94 |
| 10 | 0.85 | 77 to 92 |
| 11 | 0.94 | 71 to 85 |

TABLE 2

| Example | 2 | 12 | 13 | 14 | 15 | 16 | 17 |
|---|---|---|---|---|---|---|---|
| Phenol novolak resin | — | 30.0 | 7.5 | — | — | — | — |
| Cresol novolak resin | 30.0 | — | 22.5 | 7.2 | 27.0 | 12.5 | 30.0 |
| sec.-Butyl-bis (3-hydroxypropyl)-phosphinoxide | — | — | — | — | — | 17.5 | — |
| Silicone-modified phenolic resin* | — | — | — | 22.8 | — | — | — |
| Spherical fused quartz | 48.3 | 48.3 | 48.3 | 48.3 | 50.4 | 48.3 | — |
| Angular fused quartz | 20.7 | 20.7 | 20.7 | 20.7 | 21.6 | 20.7 | — |
| Aluminum oxide | — | — | — | — | — | — | 69.0 |
| Carbon black | 1.0 | 1.0 | 1.0 | 1.0 | 1.0 | 1.0 | 1.0 |

*Prepolymer of alkylphenol novolak resin and silicone elastomer

TABLE 3

| | Prepolymer Epoxy Resin Mixture | | Phenolic Resin Mixture | | Molar Ratio |
|---|---|---|---|---|---|
| Example | No. | Parts by Wt. | No. | Parts by Wt. | EP:OH |
| 3 | 1 | 78 | 2 | 22 | 1:0.8 |
| 18 | 5 | 72 | 15 | 28 | 1:1 |
| 19 | 1 | 74 | 2 | 26 | 1:1 |
| 20 | 1 | 81 | 2 | 19 | 1:0.6 |
| 21 | 1 | 86 | 2 | 14 | 1:0.4 |
| 22 | 8 | 74 | 2 | 26 | 1:1 |
| 23 | 7 | 75 | 15 | 25 | 1:1 |
| 24 | 9 | 75 | 15 | 25 | 1:1 |
| 25 | 10 | 74 | 2 | 26 | 1:1 |
| 26 | 4 | 78 | 2 | 22 | 1:0.8 |
| 27 | 1 | 73 | 2 | 27 | 1:1 |
| 28 | 1 | 73 | 14 | 27 | 1:1 |
| 29 | 11 | 78 | 17 | 22 | 1:0.8 |
| 32 | 30 | 78 | 2 | 22 | 1:0.8 |

TABLE 4

| | Epoxy Resin Mixture 1 | | Epoxy Resin Molding Material 3 | | Epoxy Resin Molding Material 19 | |
|---|---|---|---|---|---|---|
| Storage Time in Months* | Epox. Value mole·kg$^{-1}$ | Viscosity Pa·s/° C. | Epox. Value mole·kg$^{-1}$ | Viscosity Pa·s/° C. | Epox. Value mole·kg$^{-1}$ | Viscosity Pa·s/° C. |
| 0 | 0.86 | 95/168 | 0.62 | 105/164 | 0.61 | 125/161 |
| 0.5 | 0.83 | 95/168 | 0.65 | 110/168 | 0.62 | 140/160 |
| 1 | 0.82 | 95/168 | 0.64 | 90/169 | 0.61 | 110/164 |
| 2 | 0.85 | 100/165 | 0.63 | 110/168 | 0.62 | 100/166 |
| 3 | 0.83 | 95/167 | 0.63 | 105/168 | 0.61 | 105/165 |
| 4 | 0.84 | 100/165 | 0.64 | 100/169 | 0.60 | 120/167 |
| 5 | 0.85 | 95/168 | 0.62 | 115/168 | 0.61 | 120/168 |
| 6 | 0.85 | 95/168 | 0.62 | 110/169 | 0.62 | 120/168 |

*At room temperature and protected from moisture

TABLE 5

| Reaction Accelerator | Content* in % | Time until increase to 10 times the initial viscosity at 175° in sec. |
|---|---|---|
| 2-Phenylimidazole | 0.7 | 109 |
| 2-Phenylimidazole | 0.9 | 85 |
| 2-Ethyl-4-methylimidazole | 0.7 | 103 |
| 1-Cyanoethyl-2-phenylimidazole | 0.8 | 89 |
| 1-Cyanoethyl-2-phenylimidazole | 1.0 | 69 |
| 1-Cyanoethyl-2-phenylimidazole | 1.25 | 54 |
| 1-Cyanoethyl-2-phenylimidazole | 1.5 | 48 |

*Referred to the filler-free reaction resin mixture of polyepoxide and polyisocyanate resins.

TABLE 6

| Epoxy resin molding material No. | Molar ratio OH:EP | Time until increase to 10 times the initial viscosity at 175° in sec. |
|---|---|---|
| 3 | 0.8:1 | 59 |
| 19 | 1.0:1 | 68 |
| 20 | 0.6:1 | 47 |
| 21 | 0.4:1 | 40 |

TABLE 7

| Epoxy resin molding material No. | Curing ° C./min. | Aftercuring ° C./min. | Glass transition temperature* ° C. |
|---|---|---|---|
| 3 | 190/1 | 190/240 | 161 |
| 3 | 180/2 | 190/240 | 157 |
| 3 | 170/3 | 175/480 | 158 |
| 18 | 175/1.5 | 190/240 | 160 |
| 19 | 190/1 | 190/240 | 156 |
| 22 | 180/2 | 190/240 | 161 |
| 22 | 170/3 | 180/240 | 155 |
| 24 | 175/1 | 220/240 | 164 |
| 25 | 180/2 | 200/240 | 154 |
| 26 | 175/1 | 190/240 | 156 |
| 28 | 190/3 | 190/240 | 153 |
| 29 | 175/1.5 | 190/240 | 158 |
| 32 | 185/1.5 | 190/240 | 154 |

*TMA (thermal-mechanical analysis)

TABLE 8

| Epoxy resin molding material No. | Curing °C./min | After-curing °C./min | $\alpha_1$[1] $10^{-6} \cdot K^{-1}$ | $\alpha_2$[2] $10^{-6} \cdot K^{-1}$ | Modulus of elasticity in N·mm$^{-2}$ | |
|---|---|---|---|---|---|---|
| | | | | | 50° C. | 100° C.[3] |
| 3  | 190/1   | 190/240 | 20 | 74  | 10840 | 10360 |
| 3  | 170/3   | 175/480 | 18 | 71  | 11100 | 10570 |
| 18 | 175/1.5 | 190/240 | 18 | 68  | 10500 | 9700  |
| 19 | 190/1   | 190/240 | 19 | 75  | 11230 | 10640 |
| 22 | 180/2   | 190/240 | 19 | 68  | 10300 | 9800  |
| 22 | 170/3   | 180/240 | 20 | 71  | 10100 | 9300  |
| 25 | 180/2   | 200/240 | 18 | 71  | 11360 | 10810 |
| 26 | 175/1   | 190/240 | 19 | 72  | 10340 | 9840  |
| 28 | 190/3   | 190/240 | 19 | 79  | 8200  | 6600  |
| 29 | 175/1.5 | 190/240 | 27 | 100 | 9800  | 8980  |
| 32 | 185/1.5 | 190/240 | 19 | 75  | 10950 | 10420 |

[1] Mean value in the temperature range of 50 to 100°
[2] Mean value in the temperature range of 200 to 250°
[3] DMA (dynamic-mechanical analysis), 1 Hz

TABLE 9

| | | Molding Material (Commercial) | Epoxy resin molding material 27 |
|---|---|---|---|
| Curling (in the mold) | °C./min | 170–190/1–3 | 175–190/1–3 |
| Aftercuring (in the oven) | °C./min | 175–190/240–360 | 175–225/120–480 |
| Burning behavior | UL 94/mm | V—O/1.6 | V—O/1.6 |
| Glass transition temperature [1] | °C. | 165–166 | 156–161 |
| Coefficient of expansion | | | |
| $\alpha_1$: 50 to 150° C. | $10^{-6} \cdot K^{-1}$ | 18–20 | 18–20 |
| $\alpha_2$: 200 to 250° C. | $10^{-6} \cdot K^{-1}$ | 63–66 | 69–73 |
| Modulus of elasticity [2] | | | |
| at 50° C. | N.mm$^{-2}$ | 11500–11600 | 10800–11700 |
| 100° C. | N.mm$^{-2}$ | 10400–10500 | 10100–11100 |
| 200° C. | N.mm$^{-2}$ | 2400–2700 | 660–860 |
| glass transition temperature | N.mm$^{-2}$ | 8500–8800 | 8600–9400 |
| Decomposition temperature [3] | °C. | 355–357 | 368–374 |

[1] TMA, 5 K/min
[2] DMA, Stress-strain, 5 K/min, 1 Hz
[3] TGA, 2 k/min, 5% loss in weight ($N_2$) (TGA = thermo-gravimetric analysis)

What is claimed is:

1. A process for producing a halogen-free flame resistant, pourable, latently reactive, phenolically curable epoxy resin compression molding material comprising the steps of: producing a latently reactive prepolymer epoxy resin mixture in powder form which is free of isocyanate groups from a thermally polymerizable, filler-containing reaction resin mixture of polyepoxy resin consisting of a mixture of halogen-free difunctional epoxy resins and multi-functional, other than difunctional, epoxy resins, wherein the molar ratio of multi-functional to difunctional epoxy resin, relative to the epoxy groups, is 0.2:1 to 0.75:1, and a polyisocyanate, having a molar ratio of epoxy groups to isocyanate groups of >1:1, using an alkyl- and/or aryl-substituted imidazole as a reaction accelerator in a concentration of 0.5 to 2.5% by weight, relative to polyepoxy resin, at a reaction temperature of 130° C. to 200° C.; and mixing the epoxy resin mixture with a powdered, filler-containing halogen-free phenolic resin mixture in a molar ratio of epoxy groups to phenolic hydroxyl groups of 1:0.4 to 1:1.1.

2. The process according to claim 1 wherein the difunctional and multi-functional epoxy resins are selected from the group consisting of a bisphenol A epoxy resin, a bisphenol F epoxy resin, a phenol novolak epoxy resin, a cresol novolak epoxy resin, triglycidylisocyanurate, tetraglycidyl diaminodiphenyl methane, a polyglycidyl phosphorus resin and a silicone epoxy resin of the general formula

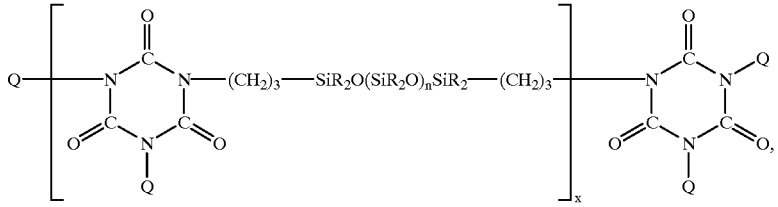

in which:
n is a whole number from 0 to 25,
x is a whole number from 0 to 3,
R is alkyl or aryl,
Q is —(CH$_2$)$_3$SiR$_2$O(SiR$_2$O)$_n$SiR$_2$R',
in which n and R have the meaning indicated above and R' is an epoxy-functional radical having 6 C atoms.

3. The process according to claim 2 wherein the content of silicone epoxy resin, relative to the amount of reaction resin mixture of polyepoxy resin and polyisocyanate is up to 20% by weight.

4. The process according to claim 1 wherein the polyisocyanate is an isomer mixture of diisocyanato-diphenyl methane or of toluene diisocyanate or a prepolymer of an isomer mixture of diisocyanato diphenyl methane.

5. The process according to claim 1 wherein in the reaction resin mixture, the molar ratio of the epoxy groups to the isocyanate groups is 1.5:1 to 4:1.

6. The process according to claim 1 wherein the reaction accelerator is 2-ethyl-4-methyl-imidazole, 2-phenylimidazole or 1-cyanoethyl-2-phenyl-imidazole.

7. The process according to claim 1 wherein the content of the reaction accelerator is 1.0 to 1.8% by weight, relative to polyepoxy resin.

8. The process according to claim 1 wherein the phenolic resin is selected from the group consisting of phenol novolaks, cresol novolaks and mixtures thereof.

9. The process according to claim 1 wherein the phenolic resin mixture contains 0.5 to 1.5% by weight of a reaction accelerator, relative to the amount of phenolic resin mixture.

10. The process according to claim 1 wherein the filler is a mineral filler or ceramic filler, selected from the group consisting of fused quartz and aluminum oxide.

11. The process according to claim 1 wherein the molar ratio of epoxy groups to phenolic hydroxyl groups in the curable epoxy resin molding material is 1:0.6 to 1:1.

* * * * *